(12) United States Patent
Wagner et al.

(10) Patent No.: US 10,502,764 B2
(45) Date of Patent: Dec. 10, 2019

(54) SIGNAL ANALYZING CIRCUIT AND METHOD FOR AUTO SETTING AN OSCILLOSCOPE

(71) Applicant: Rohde & Schwarz GmbH & Co. KG, Munich (DE)

(72) Inventors: Peter Wagner, Chemnitz (DE); Sven Barthel, Chemnitz (DE); Thomas Guenther, Waldenburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 80 days.

(21) Appl. No.: 15/863,666

(22) Filed: Jan. 5, 2018

(65) Prior Publication Data

US 2019/0212369 A1     Jul. 11, 2019

(51) Int. Cl.
*G01R 23/16* (2006.01)
*G01R 13/02* (2006.01)
(Continued)

(52) U.S. Cl.
CPC ..... *G01R 13/0272* (2013.01); *G01R 19/2506* (2013.01); *G01R 23/16* (2013.01);
(Continued)

(58) Field of Classification Search
CPC ...... G01R 23/16; G01R 23/20; G01R 35/005; G01R 31/11; G01R 19/2506; G01R 27/04
(Continued)

(56) References Cited

U.S. PATENT DOCUMENTS 5,103,402 A    4/1992  Morton et al.
6,344,844 B1   2/2002  Timm et al.
(Continued)

FOREIGN PATENT DOCUMENTS

EP    2096451 A1    9/2009

OTHER PUBLICATIONS

Hill, T.C., "Real-time spectrum analysis reveals time domain characteristics of frequency domain signals," 72nd ARFTG Microwave Measurement Symposium, pp. 102-108, Dec. 2008.

*Primary Examiner* — Giovanni Astacio-Oquendo
*Assistant Examiner* — Raul J Rios Russo
(74) *Attorney, Agent, or Firm* — Christensen O'Connor Johnson Kindness PLLC

(57) ABSTRACT

A signal analyzing circuit is described, with at least a first channel, the first channel comprising a digitizer configured to digitize an input signal into a time-and-value-discrete signal; a switching unit coupled to the digitizer, the switching unit being adapted to receive the time-and-value-discrete signal and an acquisition memory coupled to the switching unit. The switching unit is adapted to selectively activate a decimator unit in a time-domain operation mode, the decimator unit decimating the time-and-vale-discrete signal to a decimated time-and-value-discrete signal or a digital down converter unit in a spectrum view operation mode, the digital down converter unit down-converting the time-and-value-discrete signal to a down-converted time-and-value-discrete signal. The aid acquisition memory is coupled to the decimator unit in the time-domain operation mode to store the decimated time-and-value-discrete signal, the acquisition memory being not coupled to the digital down converter unit in the time-domain operation mode. The acquisition memory is coupled to the digital down converter unit in the spectrum view operation mode to store the down-converted time-and-value-discrete signal, the acquisition memory being not coupled to the decimator unit in the spectrum view operation mode. In addition, an oscilloscope and a method for auto setting an oscilloscope are described.

20 Claims, 9 Drawing Sheets

(51) Int. Cl.
    *G01R 23/20*     (2006.01)
    *G01R 35/00*     (2006.01)
    *G01R 31/11*     (2006.01)
    *G01R 19/25*     (2006.01)
    *G01R 27/04*     (2006.01)

(52) U.S. Cl.
    CPC .............. *G01R 23/20* (2013.01); *G01R 31/11* (2013.01); *G01R 35/005* (2013.01); *G01R 27/04* (2013.01)

(58) Field of Classification Search
    USPC ...................................... 324/72, 76.11–76.83
    See application file for complete search history.

(56) References Cited

U.S. PATENT DOCUMENTS

| | | |
|---|---|---|
| 8,521,460 B2 | 8/2013 | Dobyns |
| 8,675,719 B2 | 3/2014 | Dobyns et al. |
| 2003/0218553 A1* | 11/2003 | Azinger .................. H03M 7/00 341/61 |
| 2005/0080831 A1 | 4/2005 | Pickerd et al. |
| 2007/0273389 A1 | 11/2007 | Tan et al. |
| 2008/0052028 A1 | 2/2008 | Pickerd et al. |
| 2012/0078557 A1* | 3/2012 | Dobyns .............. G01R 13/0236 702/66 |
| 2012/0197598 A1 | 8/2012 | Dobyns et al. |
| 2012/0310601 A1* | 12/2012 | Martin ............... G01R 13/0272 702/190 |
| 2013/0163644 A1 | 6/2013 | Haug et al. |
| 2014/0032149 A1 | 1/2014 | Dobyns et al. |

* cited by examiner

SIGNAL ANALYZING CIRCUIT AND METHOD FOR AUTO SETTING AN OSCILLOSCOPE

FIELD OF THE DISCLOSURE

Embodiments of the present disclosure relate to a signal analyzing circuit as well as a method for auto setting an oscilloscope.

BACKGROUND

An oscilloscope has typically several input channels that can be used for analyzing appropriate signals inputted. For the analyzing, the oscilloscope has an internal signal analyzing circuit that receives the appropriate signals to be analyzed. There are signal analyzers for a long time which are able to acquire an input signal at a first channel, to acquire another input signal at a second channel and to analyze the input signals simultaneously in an oscilloscope-like manner in the time domain and in a spectrum analyzer-like manner in the frequency domain, respectively. In addition, known signal analyzers are able to acquire the first input signal and analyze the same in time and frequency domain. Spectrum analyzer-like manner means to down-convert the frequency of the input signal.

In contrast, other signal analyzers are known to offer time and direct FFT-like frequency domain analysis wherein FFT is an abbreviation for Fast Fourier Transform. FFT-like frequency domain analysis means processing a digitized input signal according to a FFT algorithm to generate frequency data without any frequency down-conversion. This is also called a simple FFT mode.

However, the simple FFT mode has a limited bandwidth as well as a limited resolution compared to down-converting the input signal as it is done in the spectrum analyzer-like manner.

Nowadays, modern multi-domain oscilloscopes make use of these longstanding concepts. They process signals both in the time domain and in the frequency domain. Accordingly, it is possible to provide information to a user regarding a time domain and a frequency domain. Other modern oscilloscopes have a built-in dedicated spectrum analyzer.

In the state of the art, oscilloscopes are known that have dedicated channels with regard to the analyzing purposes. Such conventional oscilloscopes comprise two or four time so called time-domain channels and one frequency-domain channel. This means that the time-domain channels are configured to only perform a time domain analysis whereas the frequency-domain channel is configured to only perform a frequency domain analysis. However, this limits the capability or rather the flexibility of the oscilloscope.

Moreover, oscilloscopes are known that perform the time domain analysis and the frequency domain analysis for each channel simultaneously wherein the analyzing results are stored in a subsequent acquisition memory. However, this results in an oscilloscope requiring a lot of storage capacity of the acquisition memory since both the frequency domain analysis results and the time domain analysis results are stored appropriately.

SUMMARY

There is a need for an oscilloscope providing a high capability or flexibility, which is efficient with regard to the usage of the storage capacity of the acquisition memory. Embodiments of the present disclosure aim to meet such a need, among others.

In accordance with embodiments of the present disclosure, a signal analyzing circuit is provided with at least a first channel. The first channel comprises:

a digitizer configured to digitize an input signal into a time-and-value-discrete signal;

a switching unit coupled to the digitizer, the switching unit being adapted to receive the time-and-value-discrete signal; and an acquisition memory coupled to the switching unit, wherein the switching unit is adapted to selectively:

activate a decimator unit in a time-domain operation mode, the decimator unit decimating the time-and-vale-discrete signal to a decimated time-and-value-discrete signal, or activate a digital down converter unit in a spectrum view operation mode, the digital down converter unit down-converting the time-and-value-discrete signal to a down-converted time-and-value-discrete signal, wherein the acquisition memory is coupled to the decimator unit in the time-domain operation mode to store the decimated time-and-value-discrete signal, the acquisition memory being not coupled to the digital down converter unit in the time-domain operation mode, and wherein the acquisition memory is coupled to the digital down converter unit in the spectrum view operation mode to store the down-converted time-and-value-discrete signal, the acquisition memory being not coupled to the decimator unit in the spectrum view operation mode.

Accordingly, it is ensured that the appropriate channel can be used for analyses in the time domain as well as for analyses of the spectrum of the signal depending on the switching unit, in particular its status. In fact, a time domain operation mode as well as a spectrum view mode are provided wherein the spectrum view mode differs from a frequency domain mode in that the signal processed by the respective channel corresponds to a time-and-value-discrete signal instead of frequency data. Hence, the channel used for the spectrum view mode corresponds to a time domain channel rather than a frequency domain channel that does not exist.

Furthermore, the storage capacity of the acquisition memory is not limited since the switching unit connects the acquisition memory with either the decimator unit or the digital down converter unit appropriately ensuring that only the decimated time-and-value-discrete signal or the down-converted time-and-value-discrete signal is stored in the acquisition memory which saves a lot of storage capacity. Thus, the storage capacity stored can be used appropriately. For instance, there is more free memory for spectrum analysis in the digital down conversion mode (also called spectrum view mode) if no decimated time-and-value-discrete signal data has to be stored in the acquisition memory. The additional storage capacity due to the saving can also be used for applying higher acquisition rates compared to the prior art, namely the acquisition rates used by oscilloscopes acquiring data of the time domain analysis and the spectrum view analysis simultaneously.

As either the decimator unit or the digital down converter unit is coupled to the acquisition memory, the acquisition memory is adapted to store only either the decimated time-and-value-discrete signal or the down-converted time-and-value-discrete signal. However, the acquisition memory is not adapted to store the decimated time-and-value-discrete signal and the down-converted time-and-value-discrete signal since it is not connected to the decimator unit and the digital down converter unit, simultaneously.

In the time-domain operation mode, the switching unit may couple the digitizer to the decimator unit wherein the digitizer is not coupled to the digital down converter unit.

In the spectrum view operation mode, the switching unit may couple the digitizer to the digital down converter unit wherein the digitizer is not coupled to the decimator unit.

Accordingly, decimating and down-converting does not take place simultaneously.

In addition, the storage capacity saved can be used to increase the persistence of the data provided, in particular in a digital persistence mode.

However, the respective channel does not process any frequency domain data as time-and-value-discrete signals are processed by the channel and stored in the acquisition memory, in particular decimated time-and-value-discrete signals or down-converted time-and-value-discrete signals.

In general, the signal analyzing circuit may be part of a test and measurement instrument, such as an oscilloscope. In fact, the signal analyzing circuit in some embodiments is integrated in the instrument appropriately.

The time-and-value-discrete signal relates to a time-discrete signal (also called discrete-time signal), namely signal points at equidistant times or a time series consisting of a sequence of quantities, as well as a value-discrete signal such as a digital signal. Therefore, the time-and-value-discrete signal is obtained after the digitizing step done by the digitizer. As the switching unit is connected to the digitizer, the switching unit receives the time-and-value-discrete signal provided by the digitizer. Depending on the operation mode, the time-and-value-discrete signal is processed by the decimator unit or rather the digital down converter unit.

The decimator unit receives the time-and-value-discrete signal in a certain operation mode (time domain mode). Generally, the decimator unit is used to reduce the sample rate and the amount of data related thereto. The reducing of the sample rate is also called decimation. For instance, only one sample of several samples in a certain interval is used wherein the other samples in this interval are discarded. The reduction to one sample per interval is also called simple decimation.

The digital down converter unit receives the time-and-value-discrete signal in an appropriate operation mode, namely the spectrum view mode. In general, the digital down converter unit down-converts the time-and-value-discrete signal obtained into the baseband or to an intermediate frequency. The digital down conversion may also provide decimation in addition to the frequency translation. This is called tune and zoom.

For instance, the data obtained is translated to 0 Hz using a quadrature mixer for tuning wherein this translated data is then filtered and decimated for zooming. As the digital down conversion provides complex In-phase and Quadrature data (IQ data), center frequency translation down to 0 Hz and filtering as well as data decimation afterwards are enabled to remove unwanted frequency components and reduce the data size for the respective bandwidth. In fact, digital down conversion provides multiple advantages as it reduces both on-board memory and data transfer requirements. In addition, the filtering and the decimation reduce the wideband integrated noise and improves the overall signal to noise ratio. In summary, the digital down conversion allows bandwidth and data reduction without concern of aliasing products.

Another embodiment provides a signal analyzing circuit with at least a first channel, the first channel comprising:

a digitizer configured to digitize an input signal into a time-and-value-discrete signal;

a decimator unit coupled to the digitizer to decimate the time-and-vale-discrete signal to a decimated time-and-value-discrete signal;

a first acquisition memory coupled to the decimator unit to store the decimated time-and-value-discrete signal;

a digital down converter unit assigned to the first acquisition memory such that the decimated time-and-value-discrete signal can be forwarded to the digital down converter unit to down-convert the decimated time-and-value-discrete signal to a down-converted and decimated time-and-value-discrete signal; and a second acquisition memory coupled to the digital down converter unit to store the down-converted and decimated time-and-value-discrete signal.

In this embodiment, two different acquisition memories are provided wherein the first one stores only the decimated time-and-value-discrete signal processed by the decimator unit previously. The respective data is accessed for being processed by the digital down converter unit located after the first acquisition memory to down-convert the decimated time-and-value-discrete signal appropriately in order to provide a down-converted and decimated time-and-value-discrete signal.

Thus, the first acquisition memory is positioned between the decimator unit and the down converter unit. Accordingly, the first acquisition memory is not configured to store signals from the decimator unit and the down converter unit as it only receives a signal from the decimator unit and provides the respective data for the down converter unit.

According to an aspect either the decimator unit or the digital down converter unit is operated at a certain time. This means that an input signal processed by the channel is not decimated and down-converted simultaneously since only one both units is active at the same time. Using only one of the units, namely the decimator unit and the digital down convert unit, at the same time saves resources and costs.

Another aspect provides that the switching unit comprises a first switching member and a second switching member, the first switching member being positioned in front of the decimator unit and the digital down converter unit, the second switching member being positioned after the decimator unit and the digital down converter unit. The two switching members ensure that the time-and-value-discrete signal is processed appropriately. Both switching members may be controlled simultaneously or they control each other such that it is ensured that both switching members have the corresponding switch state ensuring that the digitizer as well as the acquisition memory both are connected to either the decimator unit or the digital down converter unit.

Generally, depending on the mode activated, the decimator unit or the digital down conversion unit is activated, for instance via the switching unit, for processing the time-and-value-discrete signal.

According to another aspect, a Fourier transform unit is provided, the Fourier transform unit being adapted to convert the down-converted time-and-value-discrete signal into data used for spectrum analysis. In another embodiment, the Fourier transform unit may be adapted to convert the down-converted and decimated time-and-value-discrete signal into data used for spectrum analysis. The Fourier transform unit is associated to the digital down converter unit such that the down-converted (and decimated) time-and-value-discrete signal is Fourier transformed by the Fourier transform unit such that the respective data used for spectrum analysis is obtained. Hence, the ability is provided to analyze the respective signal with regard to its spectrum.

In some embodiments, the Fourier transform unit is coupled with the acquisition memory, in particular the second acquisition memory, accessing only data directed to the down-converted (and decimated) time-and-value-discrete signal. Accordingly, the respective down-converted time-and-value-discrete signal data is read out of the acquisition memory by the Fourier transform unit in order to obtain the respective data used to perform the analysis with regard to the spectrum of the signal.

In general, the acquisition memory acquires only signals in the time domain, namely the decimated time-and-value-discrete signal, the down-converted time-and-value-discrete signal or the down-converted and decimated time-and-value-discrete signal. In other words, only time-and-value-discrete signals, namely decimated ones or rather down-converted ones, are stored in the acquisition memory, but no data relating to the frequency domain.

In fact, the Fourier transform unit reads out the down-converted (and decimated) time-and-value-discrete signal for transforming the data appropriately to obtain data for further processing and analyzing purposes with regard to the spectrum of the signal.

For instance, the Fourier transform unit is a Fast Fourier transform unit. The Fast Fourier transformation (FFT) ensures transformation of the appropriate data in an efficient manner, in particular the calculation of the Discrete Fourier transformation (DFT).

Another aspect provides that the switching unit comprises a multiplexer unit. Thus, different switch states can be applied providing a greater diversity with regard to signal processing.

Generally, each of the switch members may be established by a multiplexer unit. Thus, the multiplexer unit provided as the first switching member may be located between the digitizer and the decimator unit as well as between the digitizer and the digital down converter unit.

The multiplexer unit provided as the second switching member may be provided between the decimator unit and the acquisition memory as well as between the digital down converter unit and the acquisition memory.

According to a certain embodiment, the decimator unit comprises at least two decimators, the at least two decimators being assigned to the switching unit. The signal processed via the decimator unit, in the corresponding operation mode, can be processed by different decimators ensuring a greater variety with regard to signal processing. For instance, both decimators are coupled to a multiplexer unit.

Particularly, the at least two decimators are configured to pass signals of a different bandwidth. For instance, the first decimator is set to pass signals of a certain bandwidth to the acquisition memory whereas the second decimator is set to pass signals of a bandwidth being lower. This results in a zoom function.

Another aspect provides that the digital down converter unit comprises at least two digital down converters, the at least two digital down converters being assigned to the switching unit. A multi (Fast) Fourier transform mode (FFT mode) may be established by converting the signal processed by the digital down converter unit differently wherein the down-converted time-and-value-discrete signals are transformed differently by the Fourier transform unit. The at least two digital down converters may also be coupled to a multiplexer unit.

For instance, the digitizer comprises an analog to digital converter and a sampler. The analog input signals are sampled using the sampler and digitized using the analog to digital converter such that the time-and-value-discrete signals are obtained for further processing. Hence, the sampler reduces the continuous-time signals into discrete time-signals that are digitized in order to obtain the time-and-value-discrete signals.

According to another aspect, at least one of the digital down-converter unit and the decimator unit is established by a field-programmable gate array. The field-programmable gate array (FGPA) may be established in a more cost-efficient manner as only one of both units, namely the digital down-converter unit and the decimator unit, is active at the same time.

Hence, the switching unit may be established by a field-programmable gate array, the field-programmable gate array being configured to implement either the decimator unit or the digital down-converter unit selectively depending on the operation mode. Accordingly, the field-programmable gate array comprises two different configurations assigned to the operation modes. In general, this embodiment corresponds to a signal analyzing circuit having two different field-programmable gate array configurations as either the decimator unit or the digital down-converter unit is implemented.

According to a certain embodiment, the signal analyzing circuit comprises several channels, each of the several channels is established like the first channel. Different signal sources may be analyzed simultaneously due to the fact that each channel can be used for time domain analysis and spectrum analysis. The respective analysis results of the different signal sources can be outputted simultaneously, in particular displayed. However, as each channel can only perform a time domain analysis or a spectrum analysis at the same time, the same signal source cannot be analyzed with regard to the spectrum and the time domain simultaneously by a single channel.

In the second embodiment, at least one of a multiplexer unit and a plurality of channels is provided. The plurality of channels may be coupled to the first acquisition memory that is coupled to the multiplexer unit. Accordingly, the data stored in the first acquisition memory can be accessed in different manner due to the multiplexer unit. Moreover, several signals may be stored in the same first acquisition memory as the plurality of channels is coupled to the first acquisition memory.

Each of the plurality of channels comprises a digitizer configured to digitize an input signal into a time-and-value-discrete signal as well as a decimator unit coupled to the digitizer to decimate the time-and-vale-discrete signal to a decimated time-and-value-discrete signal.

Embodiments of the present disclosure further provide an oscilloscope comprising a signal analyzing circuit as mentioned above. The oscilloscope can be used for time domain and spectrum analyses, in particular simultaneous analyses of different signal sources.

According to an aspect, the oscilloscope is a portable oscilloscope. A compact device is provided that may be handheld device. The display size of the portable oscilloscope is typically limited such that the different information to be displayed can be selected by the user appropriately.

Embodiments of the present disclosure further provide a method for auto setting an oscilloscope with a signal analyzing circuit, comprising the following steps:

Determining the maximum frequency of an input signal by analyzing the power of a signal above a predetermined noise threshold value in a spectrum view mode;

Switching to a time domain mode of the oscilloscope; and

Setting the decimator unit of the signal analyzing circuit to the maximum frequency determined.

This auto setting method ensures that no aliasing effects occur since the decimator unit is set appropriately due to the power analysis done previously. Thus, it is ensured that no manual input is required as the appropriate channel is operated in two different modes subsequently, namely the spectrum view mode for determining the maximum frequency and then the time domain mode for analyzing the input signal in the time domain without any aliasing effects.

In some embodiments, the signal analyzing circuit of the oscilloscope is established as mentioned above or the oscilloscope is established as mentioned above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
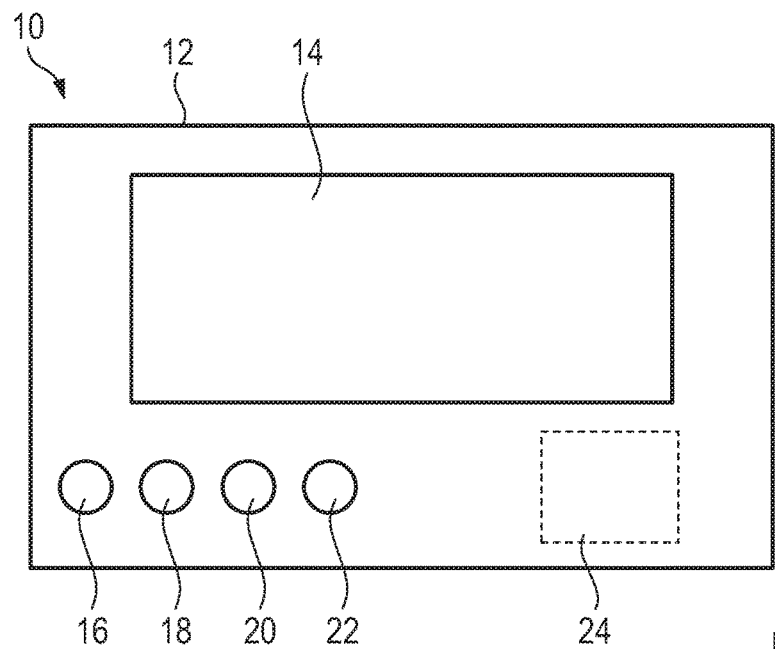
FIG. 1 shows a schematic overview of an oscilloscope according to an embodiment of the present disclosure.

In FIG. 1, an oscilloscope 10 is shown that comprises a housing 12 and a display 14 that is provided on at least one side of the oscilloscope 10. The oscilloscope 10 according to the shown embodiment comprises four inputs 16, 18, 20, 22 that are configured to receive input signals of signal source (s) to be processed by the oscilloscope 10 appropriately, for example, analyzed by the oscilloscope 10 as will be described hereinafter. In general, the oscilloscope 10 is a test and measurement instrument that can process or rather analyze signals.

The oscilloscope 10 shown in FIG. 1 is a handheld device such that the oscilloscope 10 is portable which means that it can be grabbed by a user easily and carried to a certain location for performing the tests intended.

Figure 2:
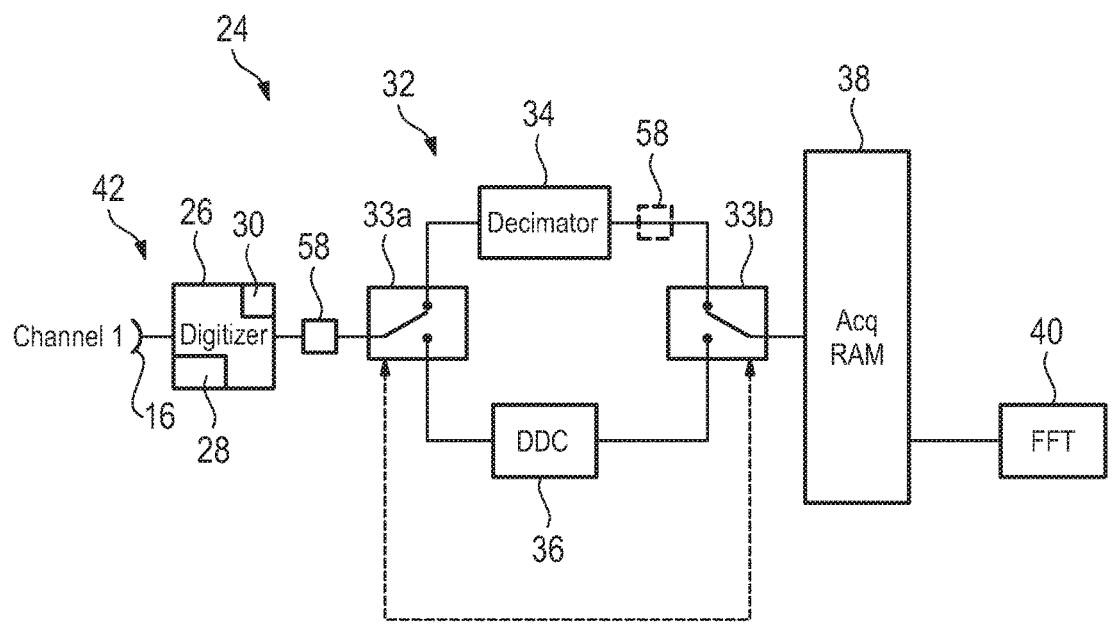
FIG. 2 shows a schematic overview of a signal analyzing circuit according to an embodiment of the present disclosure.

As already indicated by the dashed lines in FIG. 1, the oscilloscope 10 comprises an internal signal analyzing circuit 24 which is shown in more detail in FIG. 2 for a certain embodiment. The signal analyzing circuit 24 is connected with the first input 16 that is connected to a digitizer 26 that comprises inter alia a sampler 28 and an analog to digital converter 30 for providing a time-and-value-discrete signal when processing the analog input signal fed to the first input 16.

The digitizer 26 is coupled to a switching unit 32 that receives the time-and-value-discrete signal obtained after being processed by the digitizer 26. In the shown embodiment, the switching unit 32 has two switching members 33a, 33b wherein the first switching member 33a is connected directly to the digitizer 26.

The first switching member 33a may have two different switch states that are assigned to two different operation modes of the signal analyzing circuit 24, namely a spectrum view mode and a time domain mode as will be described later. Thus, the incoming line is split into two branch lines wherein only one of both branch lines can be coupled to the incoming line originating from the digitizer 26.

Further, the first switching member 33a is directly coupled to a decimator unit 34 such that the decimator unit 34 receives the time-and-value-discrete signal from the digitizer 26 via the switching unit 32, in particular the first switching member 33a, in a first switch state of the first switching member 33a assigned to the time domain operation mode.

In the time domain operation mode, the decimator unit 34 receives the time-and-value-discrete signal via the first switching member 33a and reduces the sample rate as well as the amount of data related thereto. The reducing of the sample rate is also called decimation. Accordingly, the time-and-value-discrete signal processed by the decimator unit 34 corresponds to a decimated time-and-value-discrete signal.

In addition, the first switching member 33a is also directly coupled to a digital down converter unit 36 such that the digital down converter unit 36 receives the time-and-value-discrete signal from the digitizer 26 via the first switching member 33a in a second switch state of the first switching member 33a assigned to the spectrum view operation mode.

In the spectrum view operation mode, the digital down converter unit 36 receives the time-and-value-discrete signal and down-converts the time-and-value-discrete signal obtained into the baseband or to an intermediate frequency. The digital down conversion may also provide decimation in addition to the frequency translation. This is generally called tune and zoom. Accordingly, the time-and-value-discrete signal processed by the digital down converter unit 36 corresponds to a down-converted time-and-value-discrete signal.

The decimator unit 34 as well as the digital down converter unit 36 both are directly coupled to the second switching member 33b which also has two different switch states that correspond to the ones of the first switching member 33a. Accordingly, the first and second switching members 33a, 33b establishing the switching unit 32 are located up- and downstream of the decimator unit 34 as well as the digital down converter unit 36, respectively. Hence, the first switching member 33a is positioned in front of the decimator unit 34 and the digital down converter unit 36 whereas the second switching member 33b is positioned after the decimator unit 34 and the digital down converter unit 36. In other words, the switching unit 32 accommodates both the decimator unit 34 and the digital down converter unit 36.

Both switching members 33a, 33b are linked such that it is ensured that both switching members 33a, 33b have the same switching position that relates to the respective operation mode, namely the time domain operation mode or rather the spectrum view operation mode. Accordingly, both switching members 33a, 33b may be controlled simultaneously, for instance by a separate processing unit. Alternatively, the first switching member 33a may control the second switching member 33b or vice versa.

In addition, the switching unit 32, for example, its second switching member 33b, is connected to an acquisition memory 38 that receives a time-and-value-discrete signal, namely the decimated time-and-value-discrete signal or the down-converted time-and-value-discrete signal depending on the operation mode of the signal analyzing circuit 24.

In other words, the switching unit 32, accommodating both switching members 33a, 33b, connects the digitizer 26 with the acquisition memory 38 via the decimator unit 34 or the digital down converter unit 36.

In fact, the switching unit 32 is configured to selectively activate the decimator unit 34 or the digital down converter unit 36 depending on the switch states of the respective switching members 33a, 33b. Thus, either the decimator unit 34 or the digital down converter unit 36 is operated at a certain time as only one of both units is actively connected with the digitizer 26 and the acquisition memory 38.

In other words, the acquisition memory 38 depending on the operation mode is only coupled to the decimator unit 34 or the digital down converter unit 36. Thus, the acquisition memory 38 is not coupled to the decimator unit 34 and the digital down converter unit 36 due to the switching unit 32, for example, the second switching member 33b.

In a first operation mode, namely the time domain operation mode, the second switching member 33b connects the acquisition memory 38 with the decimator unit 34 and establishes an interruption between the acquisition memory 38 and the digital down converter unit 36. Hence, the acquisition memory 38 is not coupled to the digital down converter unit 36 in the time domain operation mode.

In a second operation mode, namely the spectrum view operation mode, the second switching member 33b connects the acquisition memory 38 with the digital down converter unit 36 and establishes an interruption between the acquisition memory 38 and the decimator unit 34. Hence, the acquisition memory 38 is not coupled to the decimator unit 34 in the spectrum view operation mode.

Thus, only the decimator unit 34 or rather the digital down converter unit 36 is coupled to the acquisition memory 38.

In a similar manner, the first switching member 33a establishes a connection or an interruption with the decimator unit 34 or rather the digital down converter unit 36 such that only one of both units is coupled to the digitizer 26.

In the time domain operation mode, the first switching member 33a connects the digitizer 26 with the decimator unit 34 and establishes an interruption between the digitizer 26 and the digital down converter unit 36. Hence, the digitizer 26 is not coupled to the digital down converter unit 36 in the time domain operation mode.

In the spectrum view operation mode, the first switching member 33a connects the digitizer 26 with the digital down converter unit 36 and establishes an interruption between the digitizer 26 and the decimator unit 34. Hence, the digitizer 26 is not coupled to the decimator unit 34 in the spectrum view operation mode.

Moreover, the signal analyzing circuit 24 has a Fourier transform unit 40 that is directly coupled to the acquisition memory 38. The Fourier transform unit 40 is configured to transform the down-converted time-and-value-discrete signal into a data that can be processed and analyzed with regard to the spectrum.

For this purpose, the Fourier transform unit 40 accesses the acquisition memory 38 to read the down-converted time-and-value-discrete signal stored in the acquisition memory 38 for transforming purposes or the data assigned thereto. Hence, the Fourier transform unit 40 accesses only data directed to the down-converted time-and-value-discrete signal.

The Fourier transform unit 40 may be a Fast Fourier transform unit (FFT unit) that provides a Discrete Fourier transform (DFT) in an efficient manner.

In general, FIG. 2 shows a single channel 42 that is assigned to one input, namely the first input 16. Furthermore, at least one signal conditioning unit 58 is provided which is shown and described in more detail with regard to FIG. 7.

The at least one signal conditioning unit 58 is positioned in front of the switching unit 32, in particular in front of the first switching member 33a. However, the at least one signal conditioning unit 58 may also be provided between the first switching member 33a and the decimator unit 34 or between the first switching member 33a and the digital down converter unit 36.

Alternatively or additionally, such a signal conditioning unit 58 may be provided after the switching unit 32, for example, after the second switching member 33b. However, the signal conditioning unit 58 may also be provided between the second switching member 33b and the decimator unit 34 (as indicated by the dashed lines) or between the second switching member 33b and the digital down converter unit 36.

In general, the signal conditioning unit 58 may comprise gain, offset, coupling, filtering and/or other signal conditioning functions on the input signals received and processed appropriately. Moreover, the signal conditioning unit 58 may be a filter.

Figure 3:
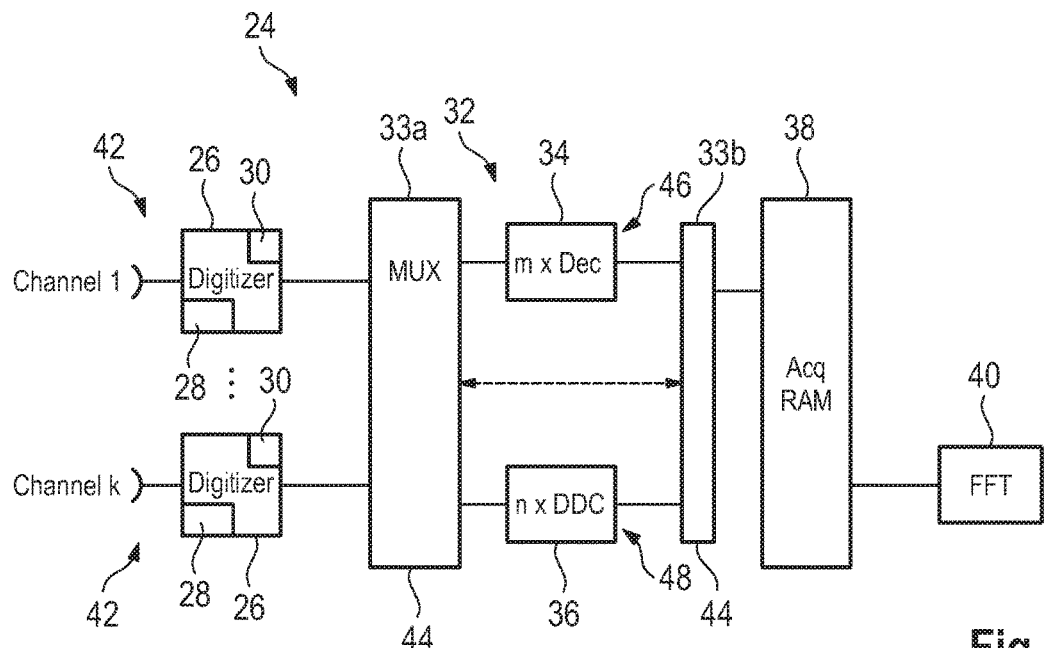
FIG. 3 shows a schematic overview of a signal analyzing circuit according to an embodiment of the present disclosure.

In FIG. 3, the same schematic overview is shown for a signal analyzing circuit 24 comprising k channels 42 each having a respective digitizer 26. The digitizers 26 of each channel 42 are coupled to a common multiplexer unit 44 acting as the first switching member 33a of the switching unit 32. The multiplexer unit 44 is assigned to several decimators 46, in particular m decimators 46, as well as several digital down converters 48, in particular n digital down converters 48.

As already indicated by the indices, the numbers of the channels 42, the decimators 46 as well as the digital down converters 48 may be different.

Figure 4:
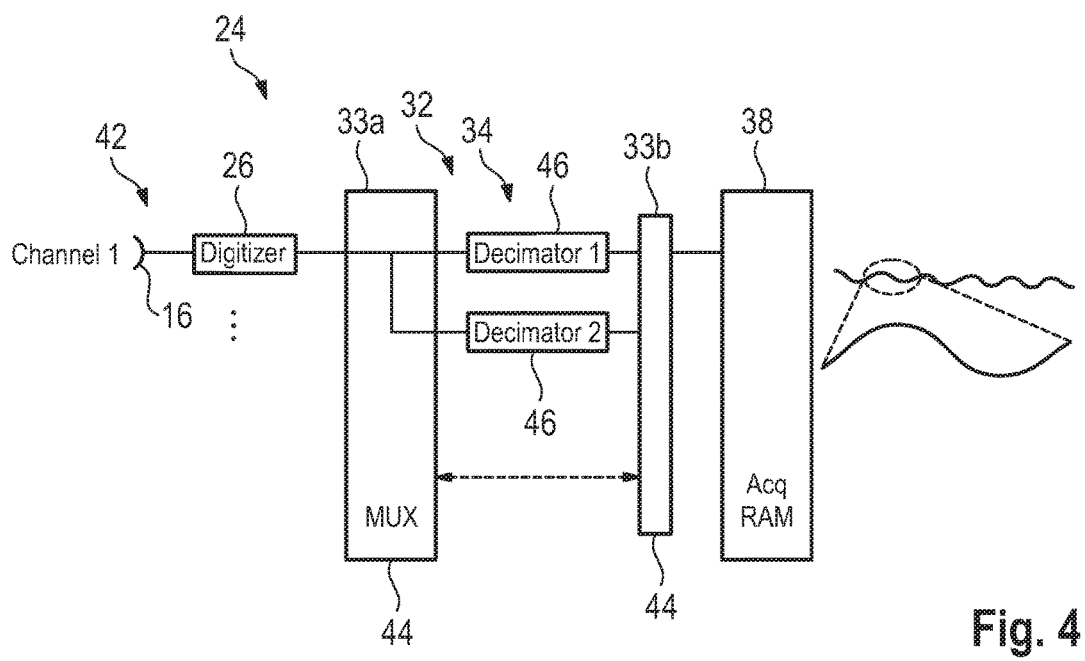
FIG. 4 shows a schematic representation of a signal analyzing circuit according to another embodiment of the present disclosure.

In general, each decimator unit 34 assigned to a single channel 42 may have at least two decimators 46 as shown in FIG. 4. Thus, the switching unit 32 assigned to a single channel 42 may comprise a multiplexer unit 44 as it connects one input (from the respective digitizer 24) with two outputs assigned to both decimators 46. In other words, the respective switching member 33a, 33b may be established each by a multiplexer unit 44.

For instance, the decimators 46 are set to pass different bandwidths of the time-and-value-discrete signal obtained from the digitizer 26 via the switching unit 32, in particular the first switching member 33a, such that two different decimated time-and-value-discrete signals are provided. This is depicted on the right side of FIG. 4 since the upper decimator 46 is set to a pass a signal with a higher bandwidth compared to the lower decimator 46. Therefore, a zoom function is possible as shown in FIG. 4.

Accordingly, the decimator unit 34 is configured to provide two decimated time-and-value-discrete signals that can be stored in the acquisition memory 38 having a different bandwidth or rather zoom factor.

The decimated time-and-value-discrete signals are directed via the second switching member 33b to the acquisition memory 38 in the respective operation mode as discussed with regard to the embodiment of FIG. 2. The second switching member 33b is established by a multiplexer unit 44, namely a second multiplexer unit 44.

Figure 5:
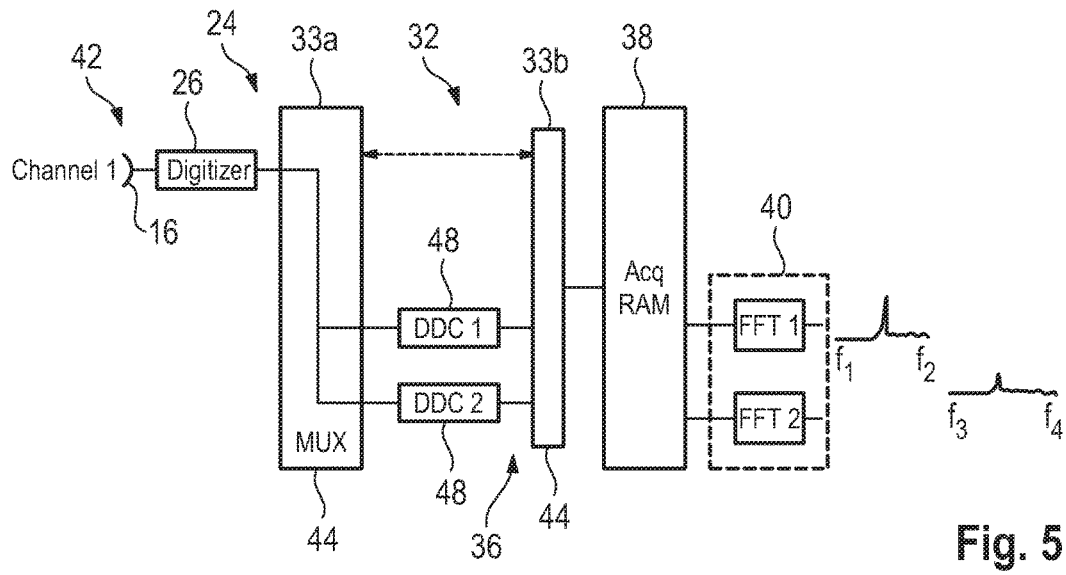
FIG. 5 shows a schematic representation of a signal analyzing circuit according to another embodiment of the present disclosure.

In a similar manner, each digital down converter unit 36 may have at least two digital down converters 48 as shown in FIG. 5.

Thus, the first switching member 33a assigned to a single channel 42 may comprise or rather be established by a multiplexer unit 44 as it connects one input (from the respective digitizer 24) with two outputs assigned to both digital down converters 48. Hence, the digital down converter unit 36 assigned to a single channel 42 is configured to provide two down-converted time-and-value-discrete signals due to the two digital down converters 48 wherein both down-converted time-and-value-discrete signals are stored in the acquisition memory 38.

As also indicated in FIG. 5, the Fourier transform unit 40 is configured to process both down-converted time-and-value-discrete signals differently.

Accordingly, the signal analyzing circuit 24 provides a multi Fourier transform mode, for instance a multi Fast Fourier transform mode (Multi FFT Mode). This becomes also obvious in FIG. 5 due to the different frequencies assigned to both down-converted time-and-value-discrete signals transformed into two data sets assigned to the spectrum after the (Fast) Fourier transform.

In a similar manner with regard to FIG. 4, the down-converted time-and-value-discrete signals are directed via the second switching member 33b to the acquisition memory 38 in the respective operation mode.

In FIGS. 4 and 5, a single channel 42 is illustrated that is assigned to a first switching member 33a being a multiplexer unit 44.

Since the signal analyzing circuit 24 may comprise several channels 42 as shown in FIG. 3, the several first multiplexer units 44, acting as first switching members 33a, may be summarized in a common first multiplexer. The same applies for the several second multiplexer units 44 acting as second switching members 33b which may be summarized in a common second multiplexer.

In a similar manner, a common decimator unit 34 as well as a common digital down converter unit 36 may be provided being assigned to all channels 42.

In general, the second switching members 33b for each channel 42 ensure that only one channel is connected to the acquisition memory 38, in particular only one sub-channel assigned to the respective decimator 46 or down-converter 48.

Figure 6:
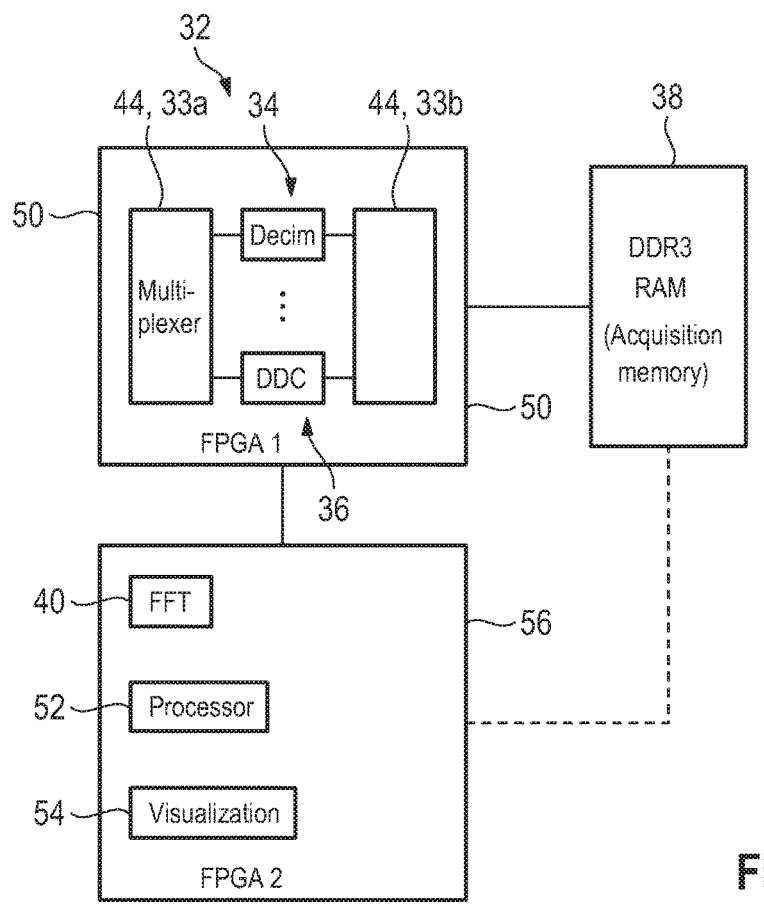
FIG. 6 shows a schematic representation of a signal analyzing circuit according to another embodiment of the present disclosure.

In FIG. 6, an implementation of at least a major part of the signal analyzing circuit 24 is shown. As shown in this embodiment, the common first and second multiplexers 44, the decimator unit 34 and the digital down converter unit 36 are established by a first field programmable gate array (FPGA) 50. Hence, the first FPGA 50 comprises the switching unit 32. In fact, the switching unit 32 is established by the first FPGA 50.

The (Fast) Fourier transform unit 40, a processing unit 52 and a visualization unit 54 (that may be connected to the display 14 of the oscilloscope 10 shown in FIG. 1) are established by a second field programmable gate array (FPGA) 56.

In addition, the acquisition memory 38 is established by a random access memory (RAM), for instance a double data rate random access memory (DDR RAM) such as a DDR3 RAM.

The acquisition memory 38 is connected to the first FPGA 50 that in turn is connected to the second FPGA 56 so that a data connection between the second FPGA 56 and the acquisition memory 38 is ensured (via the first FPGA 50). Alternatively, a direct connection between the second FPGA 56 and the acquisition memory 38 is provided.

Figure 7:
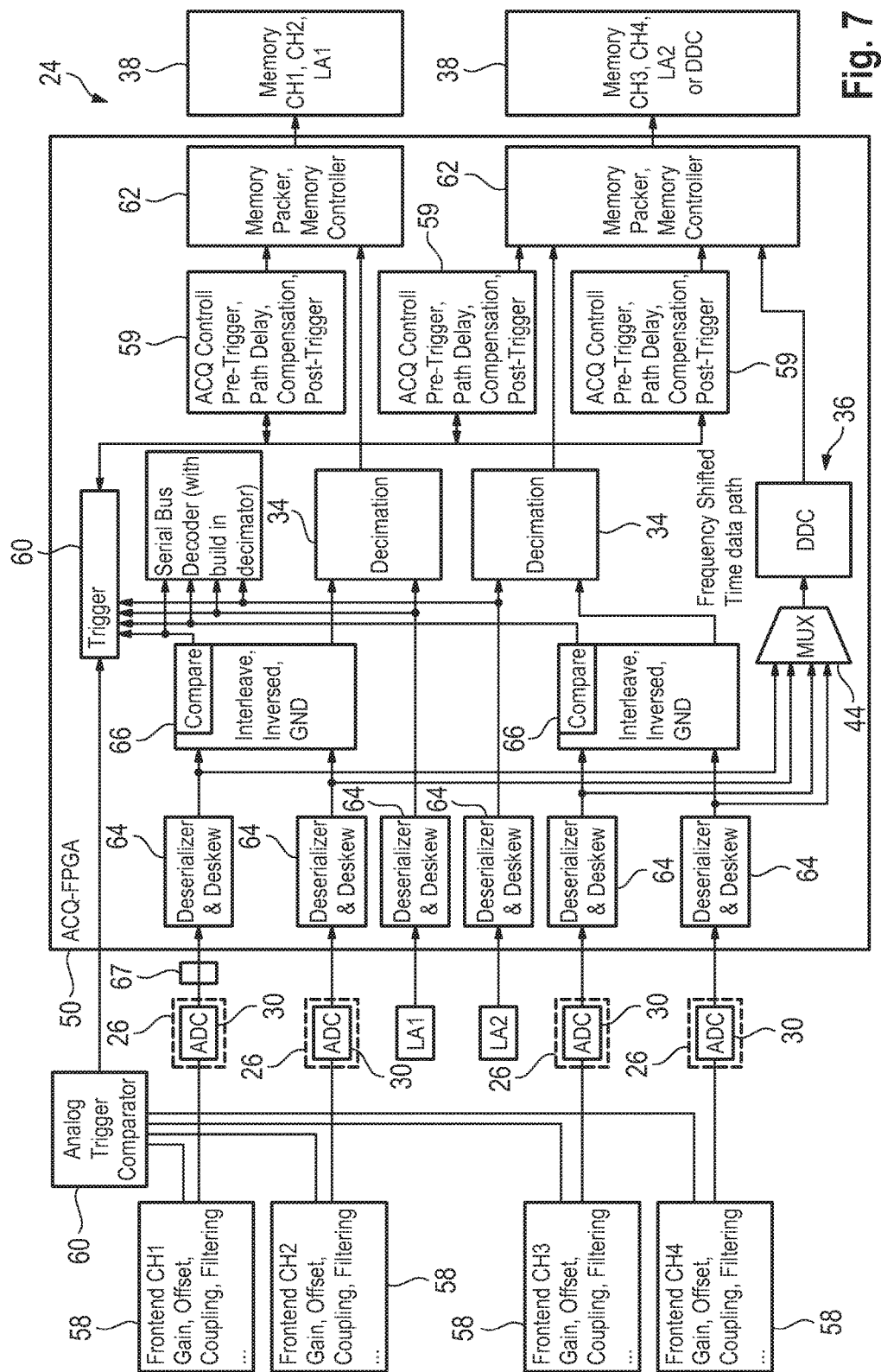
FIG. 7 shows a schematic overview of a part of a signal analyzing circuit according to an embodiment of the present disclosure.

In FIG. 7, a schematic overview of a part of the signal analyzing circuit 24 according to an embodiment of the present disclosure is shown. The four inputs 16-22 are assigned to four channels 42 each comprising a digitizer 26 illustrated by the analog to digital converters 26. The samplers 28 are not shown for illustrative purposes.

The front end of each channel 42 comprises signal conditioning units 58. These signal conditioning units 58 provide gain, offset, coupling, filtering and/or other signal conditioning functions on the input signals received.

Generally, the signal conditioning units 58 may be provided in each embodiment as shown in and already discussed with regard to FIG. 2, for instance.

The digitizers 26 provide the respective time-and-vale-discrete signals of the analog input signals inputted at the inputs 16-22.

The time-and-vale-discrete signals are forwarded to the first FPGA 50 comprising several units, in particular the multiplexer unit 44 with several acquisition control units 59, the decimator unit(s) 34 as well as the digital down converter unit(s) 36 of the respective channels 42 which are illustrated in a simplified manner for illustrative purposes.

The several acquisition control units 59 assigned to the multiplexer unit 44 comprise pre-trigger, path delay compensation and post-trigger functions.

Moreover, a triggering system 60 and a memory packer unit 62 are illustrated wherein the memory packer unit 62 is connected with the acquisition memory 38.

Figure 8:
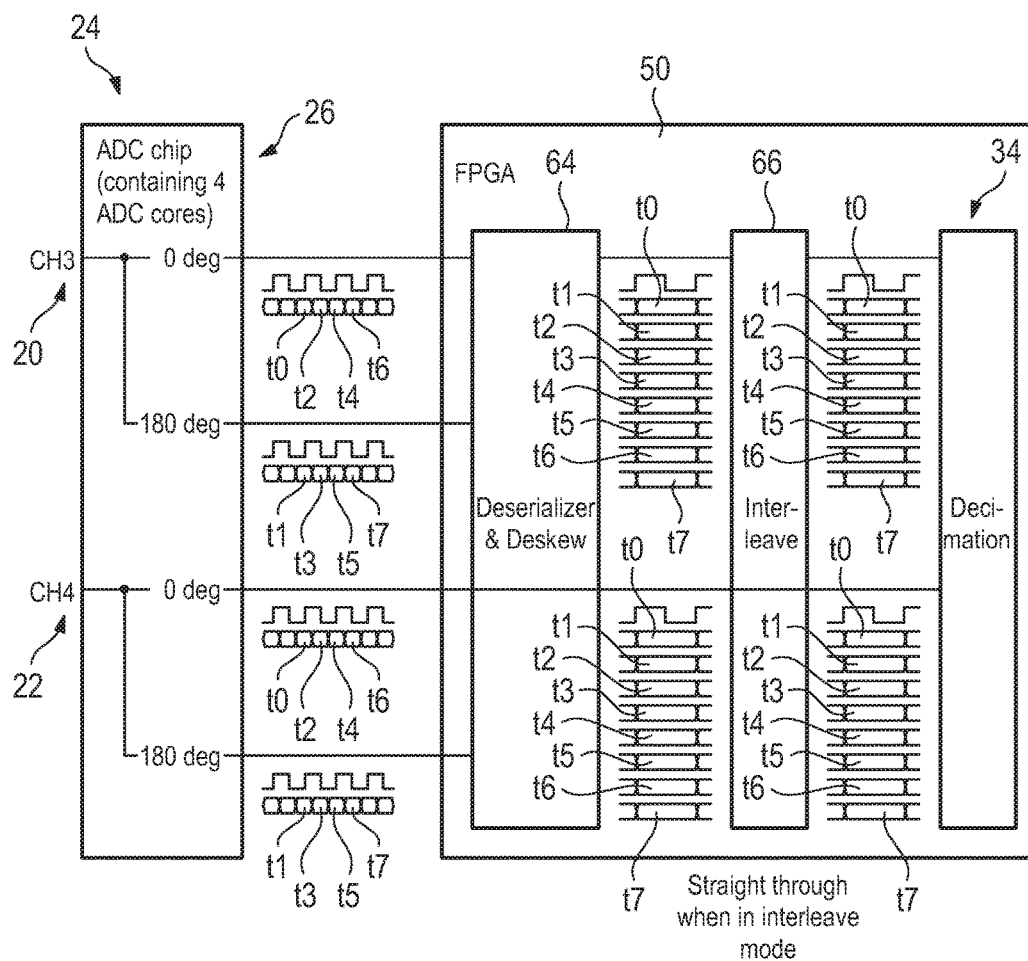
FIG. 8 shows a portion of FIG. 7 according to an embodiment of the present disclosure in more detail.
Figure 9:
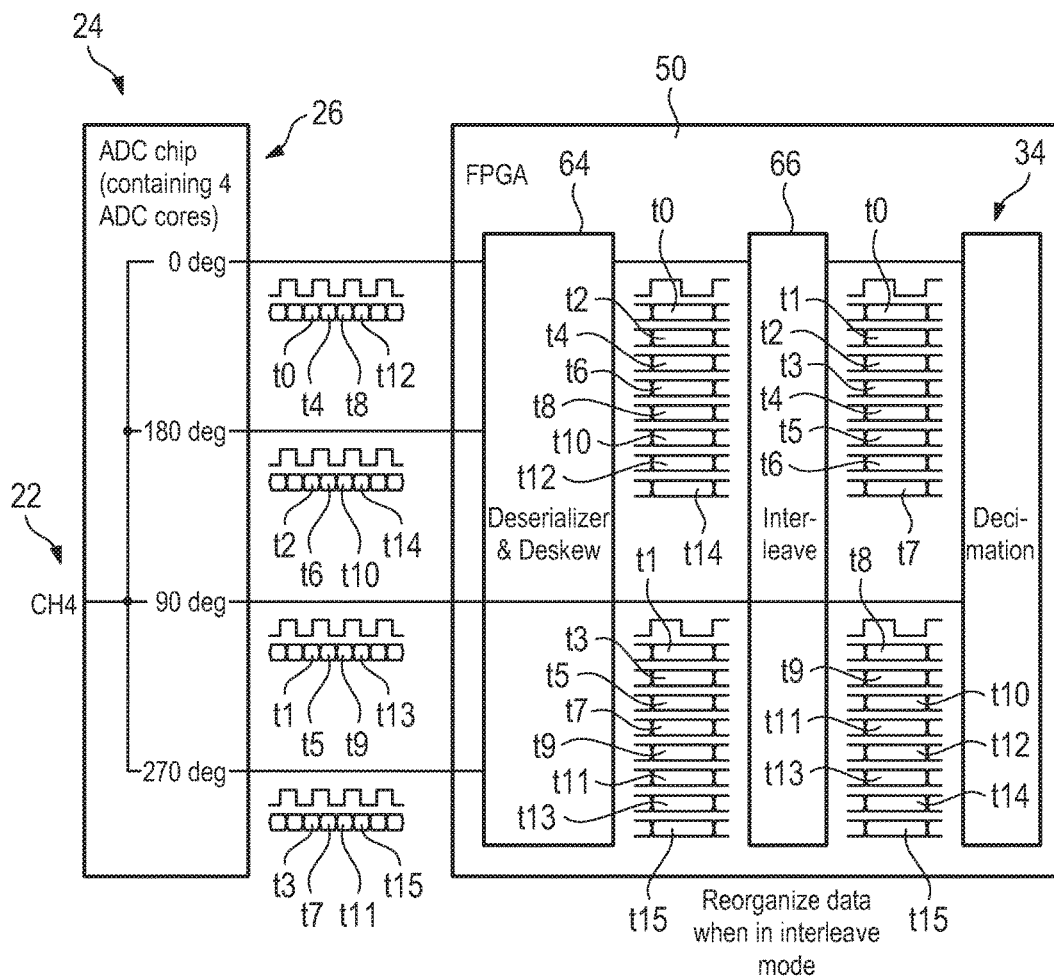
FIG. 9 shows a portion of FIG. 7 according to an embodiment of the present disclosure in more detail.

Moreover, deserializing and deskewing units 64 as well as interleaving and inversing units 66 are provided which are shown in more detail in FIGS. 8 and 9.

In addition thereto, a filter 67 (as a signal conditioning unit) is shown that is positioned after a respective analog to digital converter 30 as shown in FIG. 7 for the first channel. This may also apply in a similar manner for the other channels.

The switching unit 32 is not shown in detail for reasons of simplicity. However, the switching unit 32 may comprise two switching members 33a, 33b in a similar manner as discussed previously, in particular two switching members 33a, 33b established by first and second multiplexer units 44 positioned prior and after the respective decimator unit(s) 34 as well as the digital down converter unit(s) 36.

In FIG. 8, the interface of the signal analyzing circuit 24 with the front end is shown in more detail that illustrates the data flow from the digitizers 26 to the decimator unit 34. In the embodiment shown in FIG. 7, no interleaving is shown. The respective first switching members 33a is not shown here for reasons of simplicity.

In FIG. 9, the same illustration is provided showing the interface with an interleaved fourth channel 22.

Figure 10:
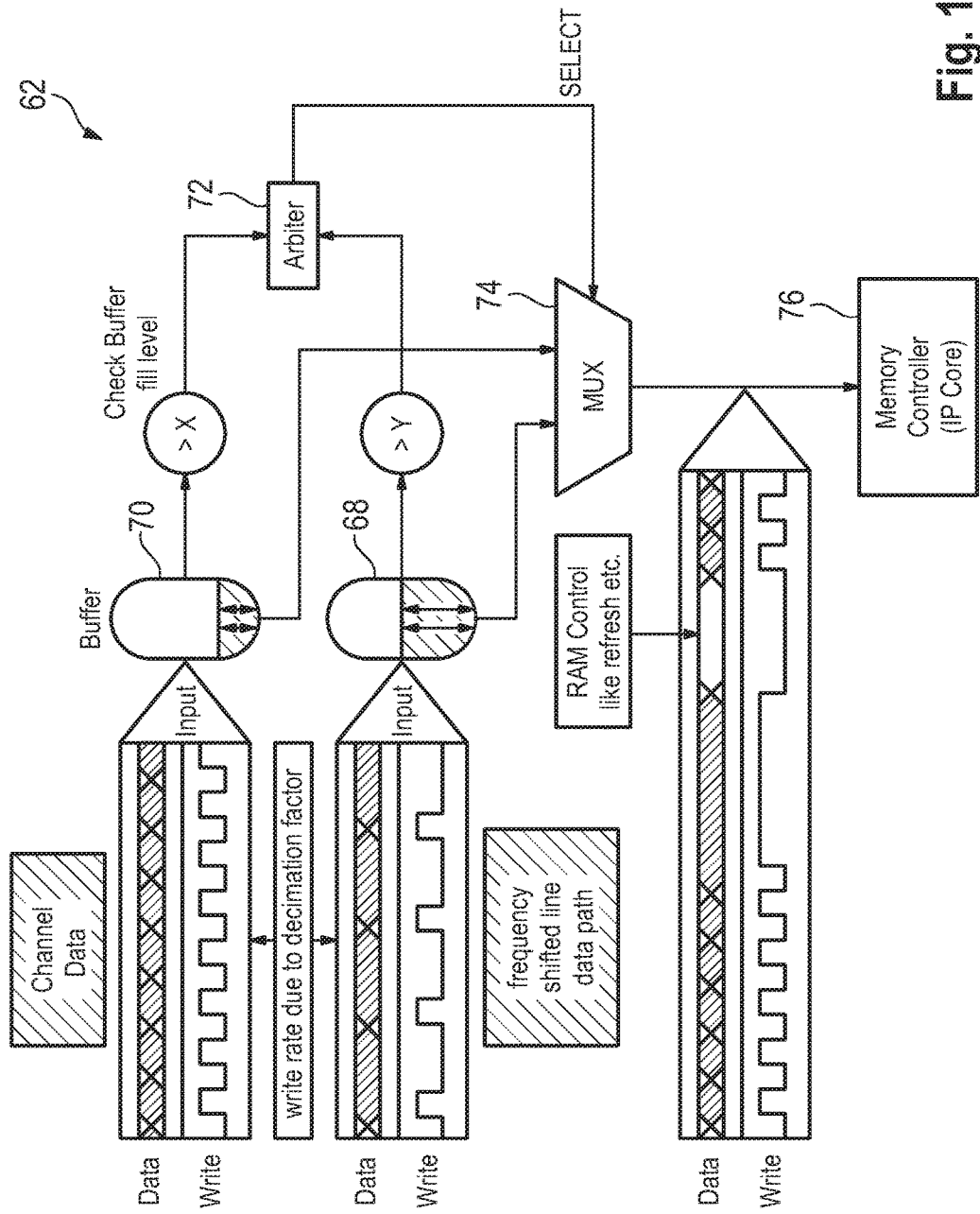
FIG. 10 shows the memory packer unit of FIG. 7 in more detail.

In FIG. 10, the memory packer unit 62 is shown in more detail. Particularly, it is shown that the data of the frequency shifted time data path comprising the digital down converter unit 36 as well as the other path comprising the decimator unit 34 are assigned to a respective buffer 68, 70.

Both buffers 68, 70 are checked by an arbiter 72 that controls a multiplexer unit 74 appropriately to forward the respective data to the memory controller 76 for being written to the acquisition memory 38.

As already mentioned previously, the data processed by the memory packer unit 62 does not comprise any frequency domain signal even though the data processed by the frequency shifted time data path relates to data that will be stored in the acquisition memory 38 for being transformed afterwards.

In general, a method for auto setting the oscilloscope 10 shown in FIG. 1 can be provided appropriately using the signal analyzing circuit 24 shown in FIG. 1, for instance.

Initially, the maximum frequency of an input signal is determined by analyzing the power of the respective signal above a predetermined noise threshold value in a spectrum view mode. Thus, the analog input signal is digitized into the time-and-value-discrete signal as described above wherein the time-and-value-discrete signal is forwarded via the first switching member 33a of the switching unit 32 towards the digital down-converter unit 36.

The digital down-converter unit 36 may down-convert the time-and-value-discrete signal appropriately such that a down-converted time-and-value-discrete signal is obtained which is forwarded to the acquisition memory 38 via the second switching member 33b of the switching unit 32 and stored in the acquisition memory 38.

In the respective operation mode, namely the spectrum view operation mode, both switching members 33a, 33b have the appropriate switch state ensuring the signal flow as described above. For this purpose, both switching members 33a, 33b, namely the switching unit 32, are controlled appropriately, for instance by a separate processing unit or by themselves.

The (Fast) Fourier transform unit 40 accesses the acquisition memory 38 for transforming the down-converted time-and-value-discrete signal into data that can be analyzed appropriately with regard to the spectrum, for example, the maximum frequency of the input signal can be determined.

Then, the oscilloscope 10, in particular the signal analyzing circuit 24, is switched from the spectrum view operation mode to a time domain mode. Thus, the first switching member 33a of the switching unit 32 is switched such that the digitizer 26 of the respective channel 42 is connected to the decimator unit 34 which is set to the maximum frequency determined previously. Simultaneously, the digitizer 26 is no more coupled to the digital down-converter unit 36.

In a similar manner, the second switching member 33b of the switching unit 32 is switched in its second switch state such that the decimator unit 34 is coupled to the acquisition memory 38 wherein the acquisition memory 38 is no more coupled to the digital down-converter unit 36. Hence, the decimated time-and-value-discrete signal can be stored in the acquisition memory 38 in an optimized manner while being automatically set.

This auto setting method ensures that no aliasing effects occur since the decimator unit 36 is set appropriately due to the power analysis done previously.

As already mentioned, the oscilloscope 10 has several inputs 16-22 wherein the oscilloscope 10, in particular the signal analyzing circuit 24, is configured to provide data used for the spectrum view (spectrum view data) as well as time domain data of different signal sources simultaneously. This can be done by setting the switching unit 32 assigned to the first channel 42 into a first switch state whereas the switching unit 32 assigned to the second channel 42 into a second switch state, for instance.

The data obtained may be displayed on the display 14 (simultaneously) if set by the user of the oscilloscope 10 appropriately.

As two different signal sources are provided simultaneously with regard to the time domain and the spectrum view, the time domain settings remain the same when the user changes settings like center frequency or span which would affect time domain settings. These two analyses are clearly separated.

This clear separation also reduces the number of operation elements required, for instance graphical user interface operation elements such that the size of the display 12 can be minimized correspondingly.

Figure 11A:
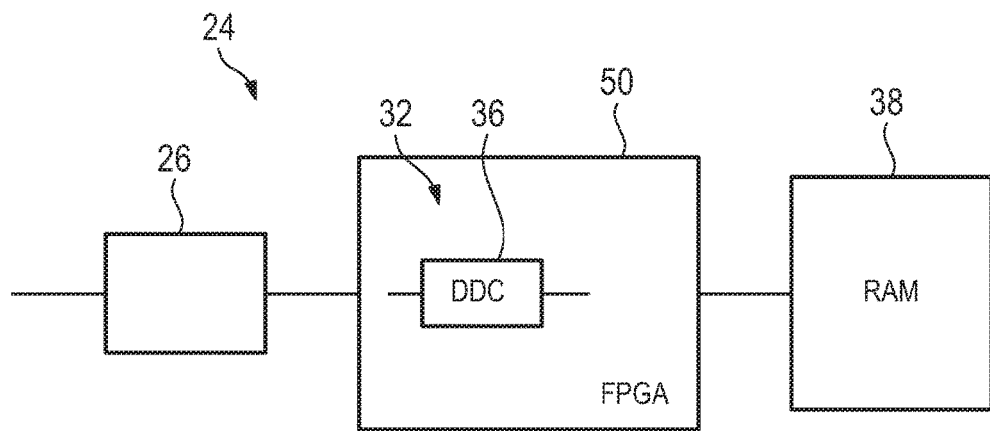
FIGS. 11a and 11b show a schematic overview of a signal analyzing circuit according to an embodiment of the present disclosure in two different configurations.
Figure 11B:
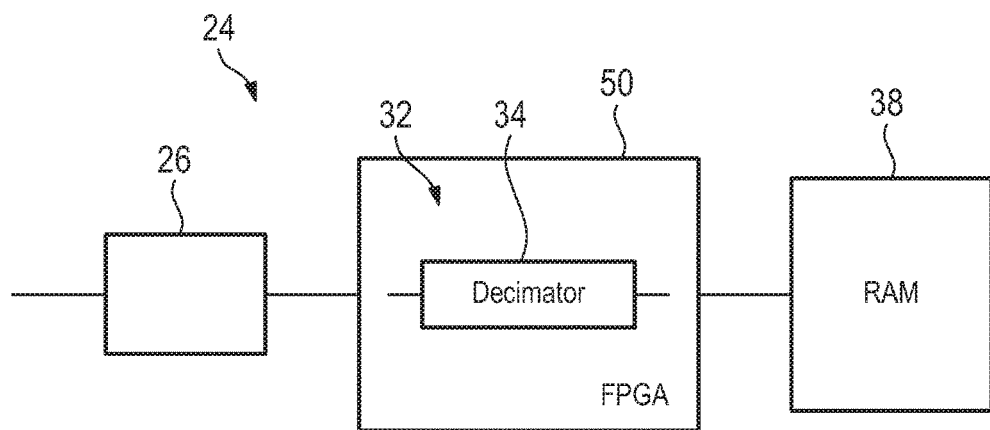

In FIGS. 11a and 11b, another embodiment is shown. In this embodiment, the switching unit 32 is established by a field-programmable gate array (FPGA), for instance the first FPGA 50. The FPGA 50 is positioned between the digitizer 26 and the acquisition memory 38 wherein the FPGA 50 comprises two different configurations that are shown in FIGS. 11a and 11b.

In the first configuration, the FPGA 50 implements the decimator unit 34 (FIG. 11a) whereas the FPGA 50 implements the digital down converter unit 36 in the second configuration (FIG. 11b). Thus, the first configuration of the FPGA 50 corresponds to the second operation mode, namely the spectrum view mode, whereas the second configuration of the FPGA 50 corresponds to the first operation mode, namely the time domain mode.

In general, the FPGA 50 is adapted to implement either the decimator unit 34 or the digital down-converter unit 36 selectively depending on the operation mode. Thus, the switching unit 32 is adapted to selectively activate either the decimator unit 34, in the time-domain operation mode, or the digital down-converter unit 36, in the spectrum view operation mode.

In a similar manner with regard to the previous embodiments, the acquisition memory 38 is coupled to the decimator unit 36 or rather the digital down converter unit 36.

In the time-domain operation mode (second configuration of the FPGA 50), the acquisition memory 38 is coupled to the decimator unit 34 to store the decimated time-and-value-discrete signal wherein the acquisition memory 38 is not coupled to the digital down converter unit 36 as it is not implemented.

In the spectrum view operation mode (first configuration of the FPGA 50), the acquisition memory 38 is coupled to the digital down converter unit 36 to store the down-converted time-and-value-discrete signal wherein the acquisition memory 38 is not coupled to the decimator unit 34 as it is not implemented.

Hence, the resources needed by the FPGA 50 can be reduced appropriately as only either the decimator unit 34 or the digital down converter unit 36 is operated at a certain time since only one of both is implemented or rather activated for signal processing.

Figure 12:
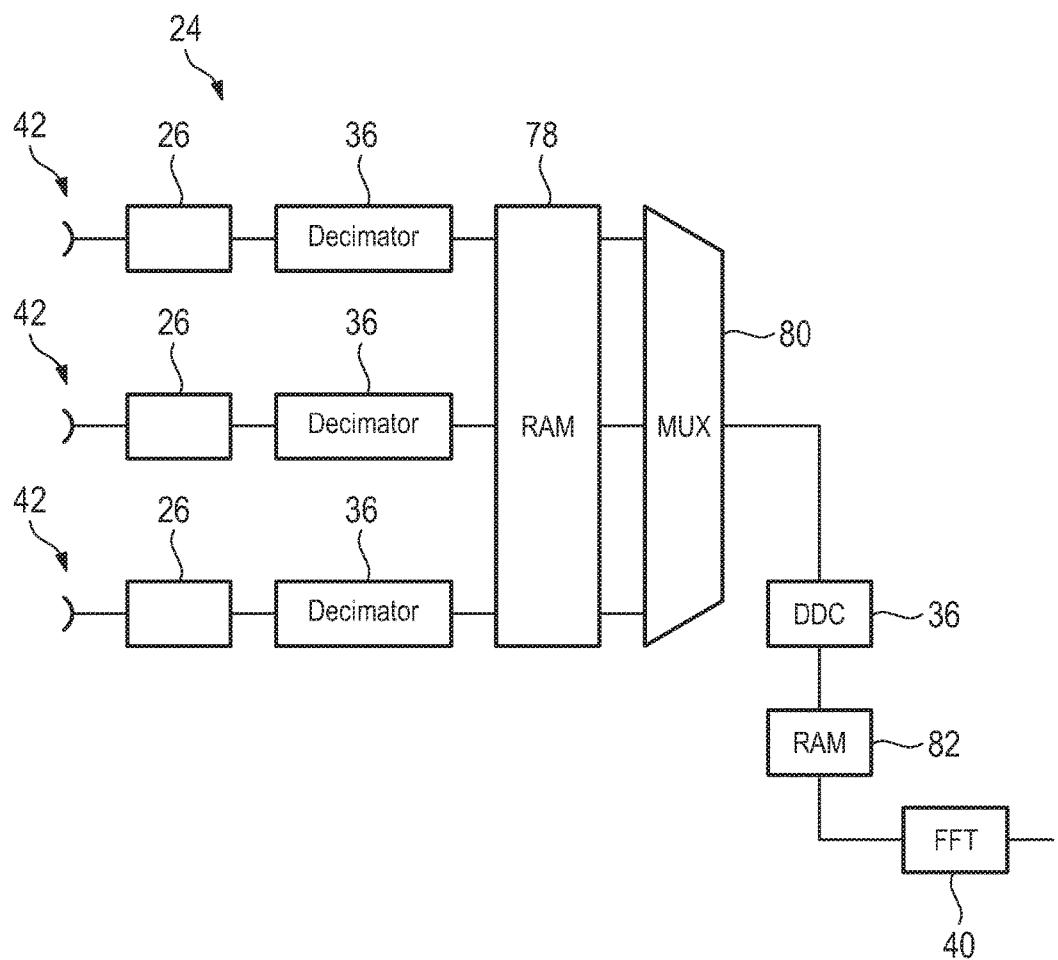
FIG. 12 shows a schematic overview of a signal analyzing circuit according to an embodiment of the present disclosure.

In FIG. 12, a third embodiment of the signal analyzing circuit 24 is shown. Three different channels 42 are shown that each comprise a digitizer 26 configured to digitize an input signal into a time-and-value-discrete signal. The three different channels 42 are connected to a respective decimator unit 34 that is coupled to the respective digitizer 26 of each channel 42 to decimate the time-and-vale-discrete signal to a decimated time-and-value-discrete signal.

The decimated time-and-value-discrete signal of each channel 42 is then forwarded to a first acquisition memory 78 that might be provided by a random access memory, in particular in a similar manner as the acquisition memory shown in the previous embodiments. In the first acquisition memory 78, the decimated time-and-value-discrete signal or the associated data is stored.

As shown in FIG. 12, a single digital down converter unit 36 is provided that is connected to the first acquisition memory 78 for accessing the decimated time-and-value-discrete signal of at least one channel 42 in order to down-convert the decimated time-and-value-discrete signal to a down-converted and decimated time-and-value-discrete signal.

The single digital down converter unit 36 is assigned to the first acquisition memory 78 via switching unit 80, for example, a multiplexer.

The down-converted and decimated time-and-value-discrete signal provided by the single digital down converter unit 36 is then forwarded to a second acquisition memory 82 and stored therein for being processed by a (F)FT unit 40. Thus, the FFT unit 40 is configured to convert the down-converted and decimated time-and-value-discrete signal into data used for spectrum analysis.

In the shown embodiment, the switching unit 80, in particular the multiplexer, ensure that only the decimated time-and-value-discrete signal assigned to the first channel 42 (bold line) is forwarded to the single digital down converter unit 36 for being processed further, in particular being down-converted and stored as a down-converted and decimated time-and-value-discrete signal in the second acquisition memory 82.

In this embodiment, the digital down converter unit 36 is provided after the first acquisition memory 78 in which the decimated time-and-value-discrete signals are stored for being acquired when providing data in the time domain.

For providing data of an input channel 42 in the spectrum view operation mode, the respective signal, being decimated previously, is read out of the acquisition memory 78 and down-converted by the digital down converter unit 36 and then stored in the second acquisition memory 82 that can be accessed by the (F)FT unit 40 for generating the respective data used for spectrum analysis.

As shown above, a single digital down converter unit 36 can be used for several input channels 42 increasing the overall efficiency.

In some embodiments, the functionality of the various components described herein can be carried out in either software, hardware, or a combination of software and hardware. In some embodiments, the hardware can include analog circuits, digital circuits, or a combination of analog and digital circuits.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal analyzing circuit with at least a first channel, said first channel comprising:
    a digitizer configured to digitize an input signal into a time-and-value-discrete signal;
    a switching unit coupled to the digitizer, said switching unit being adapted to receive said time-and-value-discrete signal; and
    an acquisition memory coupled to said switching unit,
    wherein said switching unit is adapted to selectively:
    activate a decimator unit in a time-domain operation mode, said decimator unit decimating said time-and-vale-discrete signal to a decimated time-and-value-discrete signal or
    activate a digital down converter unit in a spectrum view operation mode, said digital down converter unit down-converting said time-and-value-discrete signal to a down-converted time-and-value-discrete signal,
    wherein said acquisition memory is coupled to said decimator unit in said time-domain operation mode to store said decimated time-and-value-discrete signal, said acquisition memory being not coupled to said digital down converter unit in said time-domain operation mode, and
    wherein said acquisition memory is coupled to said digital down converter unit in said spectrum view operation mode to store said down-converted time-and-value-discrete signal, said acquisition memory being not coupled to said decimator unit in said spectrum view operation mode.

2. The signal analyzing circuit according to claim 1, wherein either said decimator unit or said digital down converter unit is operated at a certain time.

3. The signal analyzing circuit according to claim 1, wherein said switching unit comprises a first switching member and a second switching member, said first switching member being positioned in front of said decimator unit and said digital down converter unit, said second switching member being positioned after said decimator unit and said digital down converter unit.

4. The signal analyzing circuit according to claim 1, wherein a Fourier transform unit is provided, said Fourier transform unit being adapted to convert said down-converted time-and-value-discrete signal into data used for spectrum analysis.

5. The signal analyzing circuit according to claim 4, wherein said Fourier transform unit is coupled with said acquisition memory accessing only data directed to said down-converted time-and-value-discrete signal.

6. The signal analyzing circuit according to claim 4, wherein said Fourier transform unit is a Fast Fourier transform unit.

7. The signal analyzing circuit according to claim 1, wherein said switching unit comprises a multiplexer unit.

8. The signal analyzing circuit according to claim 1, wherein said decimator unit comprises at least two decimators, said at least two decimators being assigned to said switching unit.

9. The signal analyzing circuit according to claim 8, wherein said at least two decimators are configured to pass signals of a different bandwidth.

10. The signal analyzing circuit according to claim 1, wherein said digital down converter unit comprises at least two digital down converters, said at least two digital down converters being assigned to said switching unit.

11. The signal analyzing circuit according to claim 1, wherein said digitizer comprises an analog to digital converter and a sampler.

12. The signal analyzing circuit according to claim 1, wherein at least one of said digital down-converter and said decimator is established by a field-programmable gate array.

13. The signal analyzing circuit according to claim 1, wherein said switching unit is established by a field-programmable gate array, said field-programmable gate array being configured to implement either said decimator unit or said digital down-converter unit selectively depending on the operation mode.

14. A signal analyzing circuit with at least a first channel, said first channel comprising:
a digitizer configured to digitize an input signal into a time-and-value-discrete signal;
a decimator unit coupled to said digitizer to decimate said time-and-vale-discrete signal to a decimated time-and-value-discrete signal;
a first acquisition memory coupled to said decimator unit to store said decimated time-and-value-discrete signal;
a digital down converter unit assigned to said first acquisition memory such that said decimated time-and-value-discrete signal can be forwarded to said digital down converter unit to down-convert said decimated time-and-value-discrete signal to a down-converted and decimated time-and-value-discrete signal; and
a second acquisition memory coupled to said digital down converter unit to store said down-converted and decimated time-and-value-discrete signal.

15. The signal analyzing circuit according to claim 14, wherein a Fourier transform unit is provided, said Fourier transform unit being adapted to convert said down-converted and decimated time-and-value-discrete signal into data used for spectrum analysis.

16. The signal analyzing circuit according to claim 14, wherein said Fourier transform unit is coupled with said second acquisition memory accessing only data directed to said down-converted and decimated time-and-value-discrete signal.

17. The signal analyzing circuit according to claim 14, wherein at least one of a multiplexer unit and a plurality of channels is provided.

18. The signal analyzing circuit according to claim 17, wherein each of said plurality of channels comprises a digitizer configured to digitize an input signal into a time-and-value-discrete signal as well as a decimator unit coupled to said digitizer to decimate said time-and-vale-discrete signal to a decimated time-and-value-discrete signal.

19. A method for auto setting an oscilloscope with a signal analyzing circuit, comprising the following steps:
determining the maximum frequency of an input signal by analyzing the power of a signal above a predetermined noise threshold value in a spectrum view mode;
switching to a time domain mode of said; and
setting said decimator unit of said signal analyzing circuit to said maximum frequency determined.

20. The method according to claim 19, wherein said signal analyzing circuit is established by one of:
(a) a first signal analyzing circuit with at least a first channel, said first channel comprising:
a digitizer configured to digitize an input signal into a time-and-value-discrete signal;
a switching unit coupled to the digitizer, said switching unit being adapted to receive said time-and-value-discrete signal; and
an acquisition memory coupled to said switching unit,
wherein said switching unit is adapted to selectively:
activate a decimator unit in a time-domain operation mode, said decimator unit decimating said time-and-vale-discrete signal to a decimated time-and-value-discrete signal or
activate a digital down converter unit in a spectrum view operation mode, said digital down converter unit down-converting said time-and-value-discrete signal to a down-converted time-and-value-discrete signal,
wherein said acquisition memory is coupled to said decimator unit in said time-domain operation mode to store said decimated time-and-value-discrete signal, said acquisition memory being not coupled to said digital down converter unit in said time-domain operation mode, and
wherein said acquisition memory is coupled to said digital down converter unit in said spectrum view operation mode to store said down-converted time-and-value-discrete signal, said acquisition memory being not coupled to said decimator unit in said spectrum view operation mode, or
(b) a second signal analyzing circuit with at least a first channel, said first channel comprising:
a digitizer configured to digitize an input signal into a time-and-value-discrete signal;
a decimator unit coupled to said digitizer to decimate said time-and-vale-discrete signal to a decimated time-and-value-discrete signal;
a first acquisition memory coupled to said decimator unit to store said decimated time-and-value-discrete signal;
a digital down converter unit assigned to said first acquisition memory such that said decimated time-and-value-discrete signal can be forwarded to said digital down converter unit to down-convert said decimated time-and-value-discrete signal to a down-converted and decimated time-and-value-discrete signal; and
a second acquisition memory coupled to said digital down converter unit to store said down-converted and decimated time-and-value-discrete signal.

* * * * *